United States Patent
Matsui et al.

(10) Patent No.: US 9,774,249 B2
(45) Date of Patent: Sep. 26, 2017

(54) POWER SUPPLY APPARATUS, CONTROL APPARATUS, AND PROGRAM THEREFOR

(71) Applicant: FUJITSU LIMITED, Kawasaki-shi, Kanagawa (JP)

(72) Inventors: Yoshinobu Matsui, Kawasaki (JP); Hisato Hosoyama, Yokohama (JP); Tomotake Sasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 24 days.

(21) Appl. No.: 14/747,353

(22) Filed: Jun. 23, 2015

(65) Prior Publication Data

US 2016/0006347 A1    Jan. 7, 2016

(30) Foreign Application Priority Data

Jul. 4, 2014    (JP) .................................. 2014-138874

(51) Int. Cl.
*H02M 3/04* (2006.01)
*G05F 1/46* (2006.01)
(Continued)

(52) U.S. Cl.
CPC .......... *H02M 3/04* (2013.01); *G01R 27/2605* (2013.01); *G05F 1/42* (2013.01); *G05F 1/46* (2013.01); *H02M 3/155* (2013.01)

(58) Field of Classification Search
CPC .................................. G05F 3/01; H02M 3/04
(Continued)

(56) References Cited

U.S. PATENT DOCUMENTS

2006/0220661 A1    10/2006 Shimizu et al.
2008/0024099 A1*   1/2008 Oki ........................ H02M 1/08
                                                        323/282
(Continued)

FOREIGN PATENT DOCUMENTS

CN    103412265 A    11/2013
JP    2006-47283     2/2006
(Continued)

OTHER PUBLICATIONS

Extended European Search Report issued May 3, 2016 in related European Patent Application No. 15173570.1.
(Continued)

*Primary Examiner* — Jue Zhang
*Assistant Examiner* — Trinh Dang
(74) *Attorney, Agent, or Firm* — Staas & Halsey LLP

(57) ABSTRACT

A power supply apparatus includes: an inductor to which an input voltage is applied; a switching element that switches a current flowing to the inductor on and off so as to cause an induced voltage to be generated; an electrolytic capacitor that smoothes the induced voltage and outputs the voltage to a load; and a control circuit that controls the switching element, wherein the control circuit outputs a second switching control signal obtained by superimposing a degradation detection-purpose signal for detecting degradation of the electrolytic capacitor on a first control signal, detects an output voltage output by switching performed by the switching element controlled by the second control signal, and estimates the degradation of the electrolytic capacitor by using the output voltage detected, a duty cycle of the first control signal, and a frequency component of the degradation detection-purpose signal contained in the output voltage detected.

7 Claims, 7 Drawing Sheets

(51) Int. Cl.
  *G05F 1/42* (2006.01)
  *G01R 27/26* (2006.01)
  *H02M 3/155* (2006.01)
(58) Field of Classification Search
  USPC .......................................................... 323/304
  See application file for complete search history.

(56) References Cited

U.S. PATENT DOCUMENTS

| | | | |
|---|---|---|---|
| 2009/0072982 A1 | 3/2009 | Chen et al. | |
| 2011/0194871 A1* | 8/2011 | Matsumoto | G03G 15/5004 399/88 |
| 2011/0204864 A1* | 8/2011 | Sreenivas | H02M 3/1584 323/283 |
| 2011/0222319 A1 | 9/2011 | Marumo et al. | |
| 2014/0119065 A1* | 5/2014 | Sugahara | H02M 3/33523 363/21.13 |

FOREIGN PATENT DOCUMENTS

| | | |
|---|---|---|
| JP | 2008-306850 | 12/2008 |
| JP | 2009-195044 | 8/2009 |
| JP | 2011-109823 | 6/2011 |
| JP | 2011-188649 | 9/2011 |
| JP | 2013-38847 | 2/2013 |

OTHER PUBLICATIONS

Karim Abdennadher et al., "A Real time predictive maintenance system of Aluminum Electrolytic Capacitors used in Uninterrupted Power Supplies", Industry Applications Society Annual Meeting, 2008. IAS '08, IEEE, Piscataway, NJ, USA, Oct. 5, 2008.

* cited by examiner

BODE DIAGRAM

BODE DIAGRAM

| CAPACITANCE C OF ELECTROLYTIC CAPACITOR | LOAD CURRENT: 108 A | LOAD CURRENT: 216 A | ... |
|---|---|---|---|
| 10000 μF | 1.0478 | 1 (3.13 V) | ... |
| 9000 μF | 1.1083 | 1.0605 | ... |
| 8000 μF | 1.1911 | 1.1369 | ... |
| 7000 μF | 1.2930 | 1.2293 | ... |
| 6000 μF | 1.4172 | 1.3535 | ... |

POWER SUPPLY APPARATUS, CONTROL APPARATUS, AND PROGRAM THEREFOR

CROSS-REFERENCE TO RELATED APPLICATION

This application is based upon and claims the benefit of priority of the prior Japanese Patent Application No. 2014-138874, filed on Jul. 4, 2014, the entire contents of which are incorporated herein by reference.

FIELD

The embodiment discussed herein is related to a power supply apparatus, a control apparatus, and a program therefor.

BACKGROUND

In an electronic device, such as a server, there are installed integrated circuits (ICs) and electronic components that use a higher voltage than a power supply voltage or a lower voltage than the power supply voltage as an input voltage, and thus a power supply apparatus including a direct current to direct current (DC/DC) converter that raises or lowers the power supply voltage is installed in the electronic device. The DC/DC converter includes a switching control unit that detects an output voltage and generates a switching control signal, a switching element that performs on and off switching in response to the switching control signal, and a smoothing electrolytic capacitor that outputs a charge voltage as power.

There is known a life detection apparatus that determines approach of the end of life of an electrolytic capacitor included in a DC/DC converter. In an example, the life detection apparatus includes a frequency measurement unit, a comparison unit, and a life notification unit. The frequency measurement unit measures a frequency of a switching control signal. The comparison unit compares the frequency measured by the frequency measurement unit with a preset threshold value. The life notification unit provides a notification that the electrolytic capacitor is approaching the end of its life when the frequency measured by the frequency measurement unit exceeds the threshold value. For example, see Japanese Laid-open Patent Publication No. 2013-38847.

There is also known a method in which an alternating-current voltage is applied to an electric double layer capacitor and an impedance characteristic based on a frequency of the applied alternating-current voltage is measured so as to determine degradation of the electric double layer capacitor. A determination of degradation of the electric double layer capacitor is made by obtaining an inflection point appearing in an impedance characteristic due to degradation of an electrolytic solution in advance and comparing impedance values in a frequency region lower than this inflection point. For example, see Japanese Laid-open Patent Publication No. 2006-47283.

Other examples of the related art include Japanese Laid-open Patent Publication No. 2008-306850, Japanese Laid-open Patent Publication No. 2009-195044, Japanese Laid-open Patent Publication No. 2011-188649, and Japanese Laid-open Patent Publication No. 2011-109823.

In a known technique for determining whether the end of life of an electrolytic capacitor has been reached, there is provided an apparatus that generates an input signal used when a determination as to whether the end of life has been reached is made, or a detector for detecting a physical quantity used for determining whether the end of life has been reached. For example, the above-mentioned life detection apparatus includes the frequency measurement unit that measures a frequency of a switching control signal, and, in the method for determining degradation of the electric double layer capacitor, there is provided an apparatus that applies an alternating-current voltage to the electric double layer capacitor.

In the known technique, there is a problem in that the cost of manufacturing a power supply apparatus is increased because a device used for determining whether the end of life of an electrolytic capacitor has been reached is disposed in the power supply apparatus.

In one embodiment, an object is to provide a new technique that enables a determination of degradation of an electrolytic capacitor without addition of a sensor or circuit.

SUMMARY

According to an aspect of the invention, a power supply apparatus includes: an inductor to which an input voltage is applied; a switching element that switches a current flowing to the inductor on and off so as to cause an induced voltage to be generated; an electrolytic capacitor that smoothes the induced voltage and outputs the voltage to a load; and a control circuit that controls the switching element, wherein the control circuit outputs a second switching control signal obtained by superimposing a degradation detection-purpose signal for detecting degradation of the electrolytic capacitor on a first control signal, detects an output voltage output by switching performed by the switching element controlled by the second control signal, and estimates the degradation of the electrolytic capacitor by using the output voltage detected, a duty cycle of the first control signal, and a frequency component of the degradation detection-purpose signal contained in the output voltage detected.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 illustrates an example of an electrolytic capacitor capacitance estimation table.

DESCRIPTION OF EMBODIMENT

A power supply apparatus, a control apparatus, and a program therefor will be described below with reference to the drawings. It is noted that the technical scope of the present disclosure is not limited to the embodiment thereof, and extends to equivalents of the disclosure described in the claims.

A method of estimating capacitance of an electrolytic capacitor disposed in a DC/DC converter of a power supply apparatus according to an embodiment will be described before the power supply apparatus according to the embodiment is described.

Figure 1A:
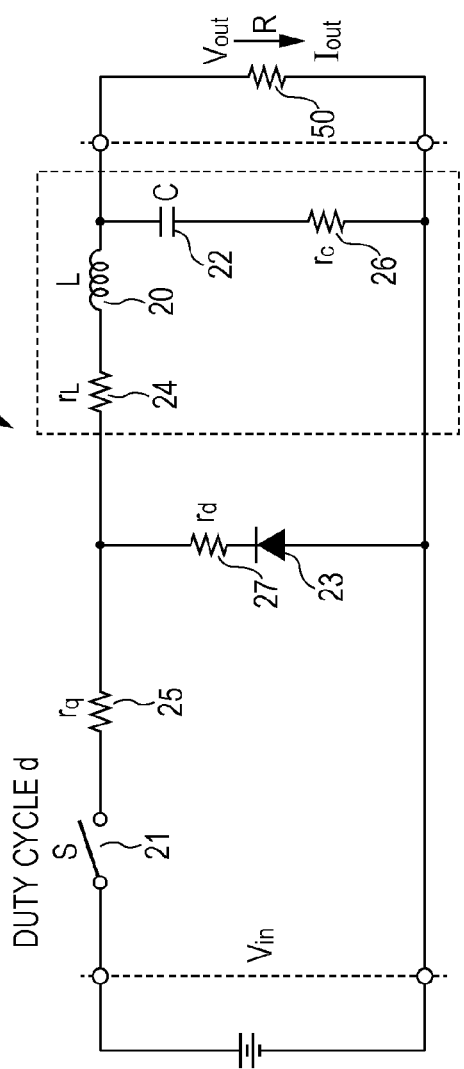
FIG. 1A is an internal circuit block diagram of a step-down DC/DC converter.
Figure 1B:
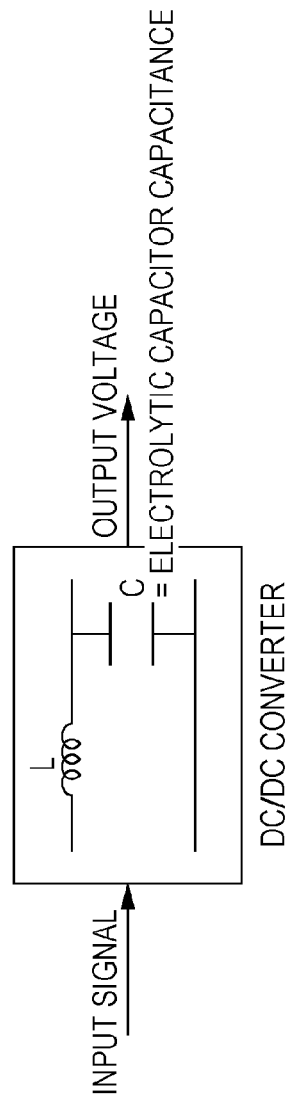
FIG. 1B illustrates an LC portion inside the DC/DC converter illustrated in FIG. 1A.

FIG. 1A is an internal circuit block diagram of a step-down DC/DC converter, and FIG. 1B illustrates an LC portion inside the DC/DC converter illustrated in FIG. 1A.

A DC/DC converter 12 includes an inductor 20, a switching element 21, an electrolytic capacitor 22, and a diode 23. The inductor 20 has an inductor resistance 24, the switching element 21 has a switching resistance 25, the electrolytic capacitor 22 has an electrolytic capacitor resistance 26, and the diode 23 has a diode resistance 27. The DC/DC converter 12 lowers an input voltage $V_{in}$ input to an input end, and outputs it as an output voltage $V_{out}$ from an output end. A load 50 is connected to the output end of the DC/DC converter 12, and an output current $I_{out}$ that flows in response to the output voltage $V_{out}$ and a resistance value R of the load 50 is supplied to the load 50.

One end of the inductor 20 is connected to an input terminal via the switching element 21, and the other end is connected to one end of the electrolytic capacitor 22. The inductor 20 generates an induced voltage in response to changes in flowing current due to on and off switching performed by the switching element 21, and outputs the generated induced voltage to the electrolytic capacitor 22. The induced voltage generated by the inductor 20 contains a switching frequency component having a switching frequency $\omega_s$ at which the switching element 21 is switched on and off.

The switching element 21 is subjected to on and off control at the switching frequency $\omega_s$. The switching element 21 is controlled by a control signal whose duty cycle d has been changed so that the output voltage $V_{out}$ becomes a predetermined voltage, and is thereby controlled so that the output voltage $V_{out}$ becomes a given voltage.

The electrolytic capacitor 22 smoothes the induced voltage output from the inductor 20 and outputs it as the output voltage $V_{out}$. The output voltage $V_{out}$ smoothed by the electrolytic capacitor 22 contains the switching frequency component having the switching frequency $\omega_s$.

The diode 23 keeps a current that flows in response to an input voltage via the switching element 21 when the switching element 21 is in an on state from flowing to the ground side. The diode 23 also forms a path of a current that flows to the load 50 in response to the induced voltage generated in the inductor 20 when the switching element 21 is in an off state.

The inductor 20 and the electrolytic capacitor 22 that are surrounded by a dashed line in FIG. 1A form a series LC resonant circuit. An average voltage of an input signal input to a portion surrounded by the dashed line is represented by $V_{in} \cdot d$ with the input voltage $V_{in}$, which is a direct-current voltage, and the duty cycle d. That is, the DC/DC converter 12 is a resonant circuit in which resonance occurs due to the input signal whose amplitude voltage $V_{in}$ is intermittently input at the switching frequency $\omega_s$ and the duty cycle d.

Figure 2A:
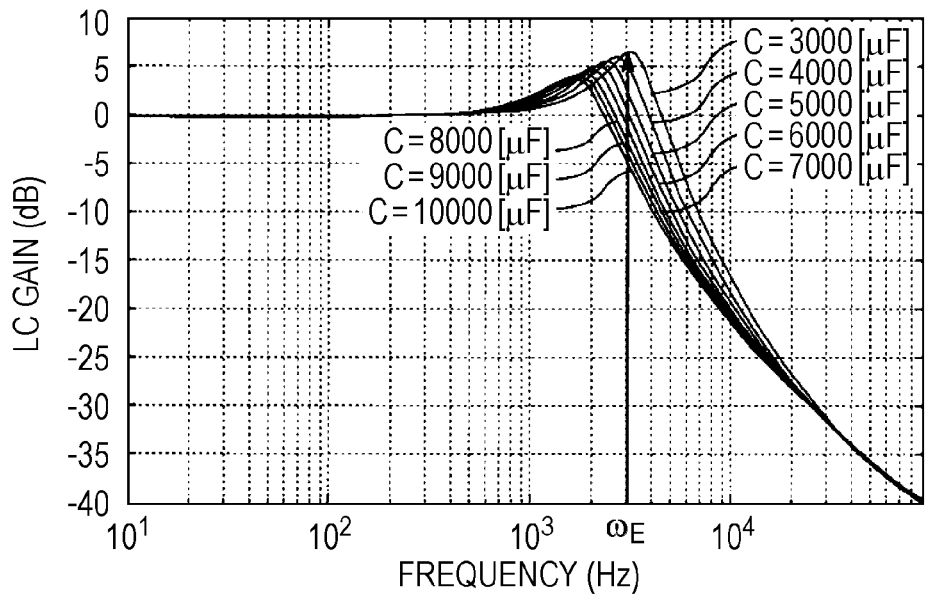
FIG. 2A illustrates an example of gain characteristics of the LC portion inside the DC/DC converter illustrated in FIG. 1B.
Figure 2B:
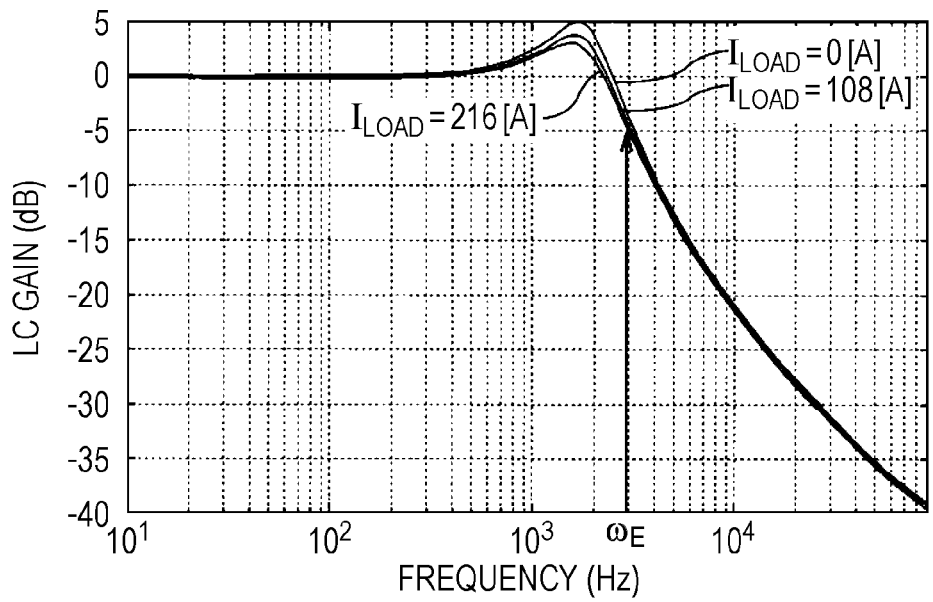
FIG. 2B illustrates another example of gain characteristics of the LC portion inside the DC/DC converter illustrated in FIG. 1B.

FIG. 2A illustrates an example of gain characteristics of the LC portion inside the DC/DC converter illustrated in FIG. 1B, and FIG. 2B illustrates another example of gain characteristics of the LC portion inside the DC/DC converter illustrated in FIG. 1B.

FIG. 2A illustrates gain characteristics exhibited when capacitance C of the electrolytic capacitor 22 is changed from 3000 μF to 10000 μF at intervals of 1000 μF in the case where inductance L of the inductor 20 is 700 nH. Here, a load current $I_{LOAD}$, which is a direct-current component of the output current $I_{out}$, is 0 A. In FIG. 2A, the horizontal axis represents the frequency of an input signal, and the vertical axis represents the ratio of the output voltage $V_{out}$ to the amplitude of the voltage $V_{in} \cdot d$ of the input signal of the circuit illustrated in FIG. 1B, that is, the gain of the circuit illustrated in FIG. 1B. In the present specification, the gain of the circuit illustrated in FIG. 1B is referred to as an LC gain.

As indicated in equation (1), the LC gain is a transfer function when the voltage represented by $V_{in} \cdot d$ with the input voltage $V_{in}$ and the duty cycle d is defined as an input and the output voltage $V_{out}$ is defined as an output.

$$L[V_{out}(t)] = C_V(sI - A_1)^{-1} B_1 L[V_{in} d(t)] \qquad (1)$$

where $A_1$ is $$A_1 := \begin{bmatrix} -\dfrac{(r_q + r_L + \alpha r_C)}{L} & -\dfrac{\alpha}{L} \\ \dfrac{\alpha}{C} & -\dfrac{\alpha}{CR} \end{bmatrix}$$

$B_1$ is $$B_1 := \begin{bmatrix} \dfrac{1}{L} \\ 0 \end{bmatrix}$$

$C_V$ is
$C_V := [\alpha r_C \ \alpha]$
and, $\alpha$ is $$\alpha := \frac{R}{R + r_C}$$

In equation (1), $V_{in}$ is an input voltage, d(t) is a duty cycle, and $V_{out}$ is an output voltage. The duty cycle d changes temporally in accordance with load conditions, and thus is a function of time. Also, in equation (1), L is inductance of the inductor 20, and C is capacitance of the electrolytic capacitor 22. Furthermore, in equation (1), $r_d$ is a resistance value of the diode resistance 27, $r_L$ is a resistance value of the inductor resistance 24, $r_q$ is a resistance value of the switching resistance 25, and $r_C$ is a resistance value of the electrolytic capacitor resistance 26.

In the example illustrated in FIG. 2A, LC gain peaks appear at resonance frequencies in a range of from 1 kHz to 5 kHz. A frequency of an LC gain peak is determined based on the inductance L of the inductor 20 and the capacitance C of the electrolytic capacitor 22. That is, if it is assumed that the inductance L of the inductor 20 is not changed, a frequency of an LC gain peak is determined based on the capacitance C of the electrolytic capacitor 22. Similarly, in the proximity of the LC gain peak, an LC gain at a frequency differs in accordance with the capacitance C of the electrolytic capacitor 22. A value obtained by multiplying an LC gain at a frequency $\omega_E$ for an estimation purpose by $V_{in} \cdot d$ is an estimation-purpose frequency component $V_{\omega E}$ of the output voltage $V_{out}$. Hence, the capacitance C of the electrolytic capacitor 22 may be estimated by superimposing an estimation signal having the estimation-purpose frequency $\omega_E$, which is a frequency in the proximity of the LC gain peak, on the switching frequency $\omega_s$, and detecting the estimation-purpose frequency component $V_{\omega E}$ of the output voltage $V_{out}$. In an example, the estimation-purpose frequency $\omega_E$ may be set to 3 kHz.

However, at a frequency in the proximity of a frequency at which an LC gain peak appears due to a resonance frequency, an LC gain increases due to even an increase in the output current $I_{out}$.

FIG. 2B illustrates gain characteristics exhibited when the load current $I_{LOAD}$ is changed to 0 A, 108 A, and 216 A in the case where the inductance L of the inductor 20 is 700 nH and the capacitance C of the electrolytic capacitor 22 is 10000 μF. In FIG. 2B, the horizontal axis represents the frequency of an input signal, and the vertical axis represents the LC gain of the circuit illustrated in FIG. 1B.

In the gain characteristics illustrated in FIG. 2B, LC gain peaks appear in a range of from 1 kHz to 2 kHz, and thus a frequency band thereof overlaps that of the LC gain peaks due to resonance frequencies in the range of from 1 kHz to 5 kHz. For this reason, in order to estimate the capacitance C of the electrolytic capacitor 22, variations in LC gain due to a resonance frequency and variations in LC gain due to the output current $I_{out}$ have to be separated from each other.

In order to separate variations in LC gain due to the resonance frequency from variations in LC gain due to the output current $I_{out}$, it is considered that the load current $I_{LOAD}$, which is a direct-current component of the output current $I_{out}$, is estimated by using the output voltage $V_{out}$ and the duty cycle d. Then, the capacitance C of the electrolytic capacitor 22 is estimated from variations in LC gain due to the resonance frequency at the estimated load current $I_{LOAD}$, that is, a relationship between the estimation-purpose frequency component $V_{\omega E}$ of the output voltage $V_{out}$ and the capacitance C of the electrolytic capacitor 22.

In the power supply apparatus according to the embodiment, the load current $I_{LOAD}$ is estimated from the output voltage $V_{out}$ and the duty cycle d, and the capacitance C of the electrolytic capacitor 22 is estimated from a correspondence relationship between the capacitance C of the electrolytic capacitor 22, and the estimated load current $I_{LOAD}$ and the estimation-purpose frequency component $V_{\omega E}$ of the output voltage $V_{out}$.

That is to say, in a power supply apparatus, while a load is being driven, a control circuit outputs, to a switching element, a test control signal obtained by superimposing an estimation signal having an estimation-purpose frequency lower than a switching frequency on a control signal for performing on and off control on the switching element at the switching frequency. Then, a control unit detects an output voltage, extracts an estimation-purpose frequency component of the output voltage from the output voltage, and also estimates a load current by using the output voltage and a duty cycle. Then, the control circuit estimates capacitance of an electrolytic capacitor from the load current and the estimation-purpose frequency component of the output voltage by using a correspondence relationship between the capacitance of the electrolytic capacitor, and the load current and the estimation-purpose frequency component of the output voltage. Since the control circuit estimates the capacitance of the electrolytic capacitor by using only an output voltage and a duty cycle that are used for controlling the output voltage of a DC/DC converter, a dedicated device, such as a sensor, for estimating the capacitance of the electrolytic capacitor may be removed from the power supply apparatus.

Figure 3:
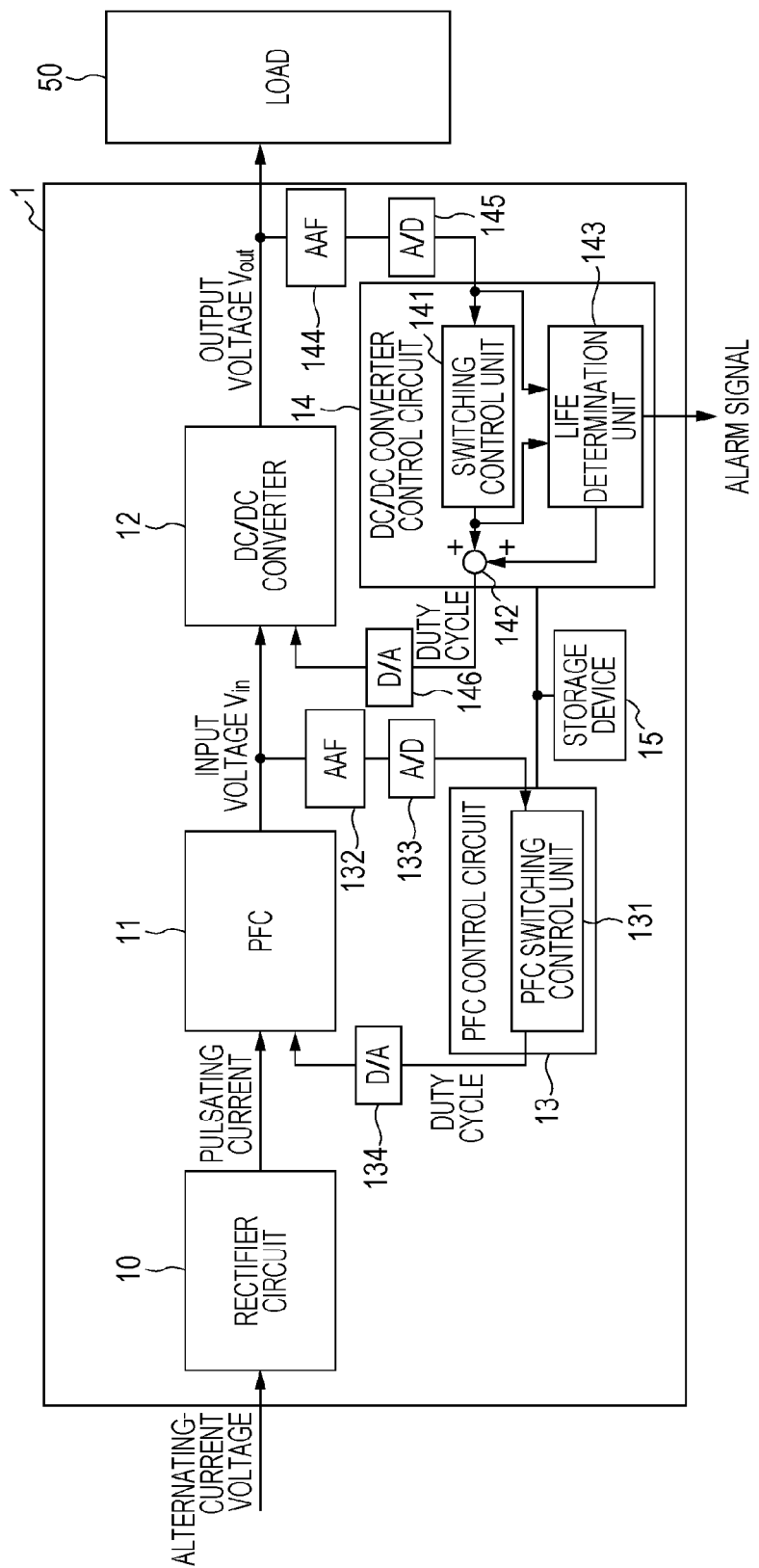
FIG. 3 is a circuit block diagram of a power supply apparatus according to an embodiment.

FIG. 3 is a circuit block diagram of the power supply apparatus according to the embodiment.

A power supply apparatus 1 includes a rectifier circuit 10, a power factor correction (PFC) circuit 11, the DC/DC converter 12, a PFC control circuit 13, a DC/DC converter control circuit 14, and a storage device 15. In the power supply apparatus 1, an alternating-current voltage is input to an input end, and an output voltage $V_{out}$ is output from an output end of the power supply apparatus 1. The load 50 is connected to the output end of the power supply apparatus 1.

The rectifier circuit 10 includes four diodes connected in the form of a bridge, and a smoothing capacitor. The four diodes perform full-wave rectification on the input alternating-current voltage and outputs it to the smoothing capacitor, and the smoothing capacitor smoothes the full-wave rectified voltage and outputs a pulsating current.

The PFC circuit 11 has the same circuit configuration as the DC/DC converter illustrated in FIG. 1A, and converts the pulsating current input from the rectifier circuit 10 into an input voltage $V_{in}$ to be input to the DC/DC converter 12. The input voltage $V_{in}$ generated by the PFC circuit 11 contains a low-frequency component of not more than 10 Hz.

The DC/DC converter 12 has the circuit configuration illustrated in FIG. 1A as in the PFC circuit 11, and lowers the input voltage $V_{in}$ input from the PFC circuit 11 and outputs the output voltage $V_{out}$ to the load 50.

The PFC control circuit 13 is a digital signal processor (DSP), and includes a PFC switching control unit 131 that controls the PFC circuit 11 by using a computer program (also referred to as a program in the present specification) stored in the storage device 15. The input voltage $V_{in}$ is input to the PFC switching control unit 131 via an anti-aliasing filter (AAF) 132 and an analog-to-digital (AD) converter 133, and the PFC switching control unit 131 outputs a PFC switching control signal to a switching element 21 of the PFC circuit 11 via a digital-to-analog (DA) converter 134. The PFC switching control unit 131 generates a PFC switching control signal whose duty cycle has been changed so that the input voltage $V_{in}$ becomes a given value.

The DC/DC converter control circuit 14 is a DSP, and executes control on the DC/DC converter 12 and a predetermined process of estimation processing of capacitance C of the electrolytic capacitor 22 by using a program stored in the storage device 15. The DC/DC converter control circuit 14 may also be connectable to a computer-readable recording medium that is capable of storing a program of a process executed by the DC/DC converter control circuit 14. Examples of the recording medium to be used include portable recording media, such as a compact disc-read only memory (CD-ROM), a digital versatile disc (DVD), and a Universal Serial Bus (USB) memory, a semiconductor memory, such as a flash memory, and a hard disk drive. As for the DSP constituting the PFC control circuit 13 and the DSP constituting the DC/DC converter control circuit 14, a common DSP may also be provided.

Figure 4:
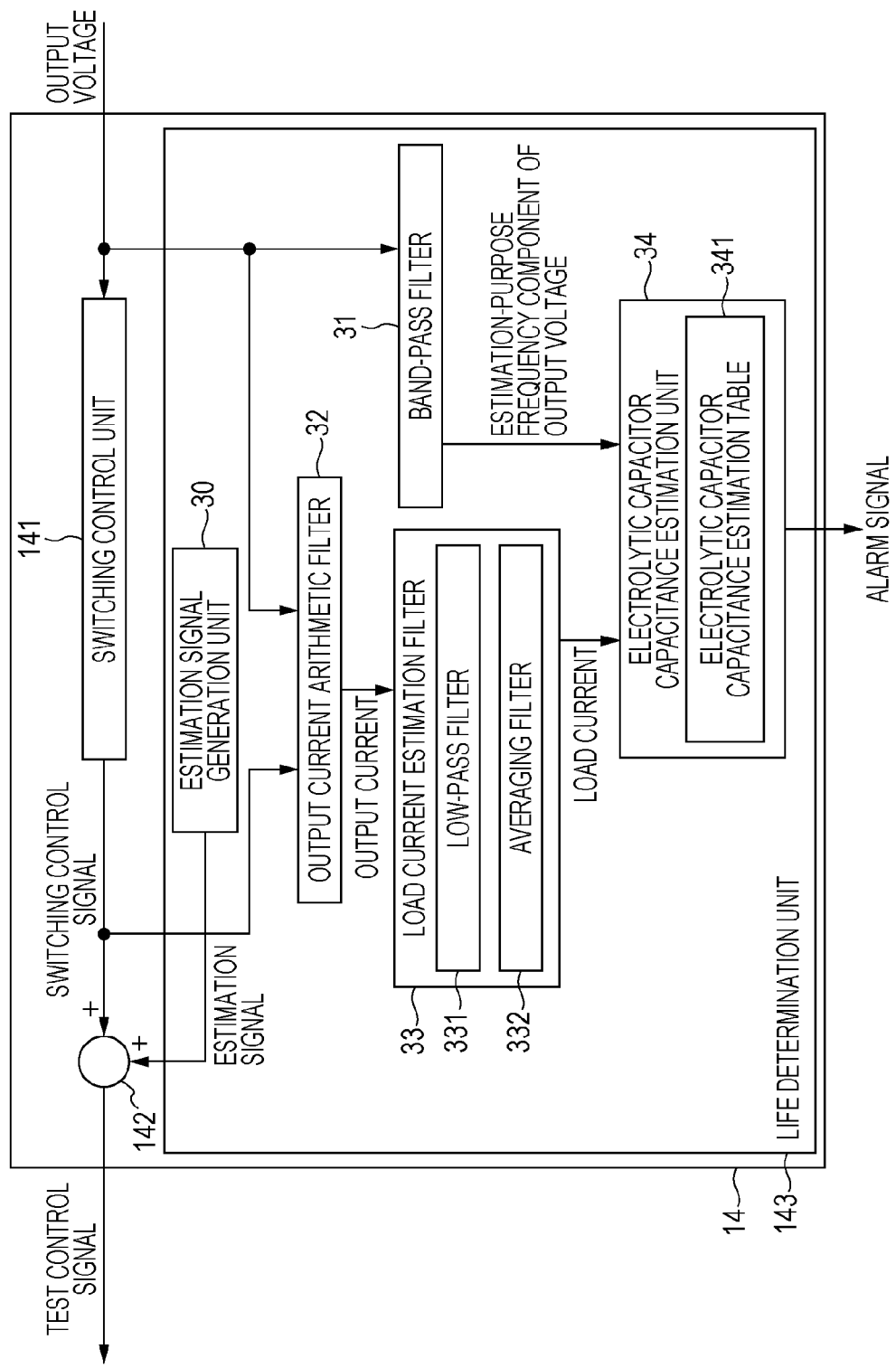
FIG. 4 is a functional block diagram of a DC/DC converter control circuit illustrated in FIG. 3.

FIG. 4 is a functional block diagram of the DC/DC converter control circuit 14.

The DC/DC converter control circuit 14 includes a switching control unit 141, a test control signal generation unit 142, and a life determination unit 143. The output voltage $V_{out}$ is input to the switching control unit 141 via an AAF 144 and an AD converter 145, and the switching control unit 141 outputs a switching control signal to the switching element 21 of the DC/DC converter 12 via a DA converter 146.

As in the PFC switching control unit 131, the switching control unit 141 generates a switching control signal whose duty cycle d has been changed so that the output voltage $V_{out}$ becomes a given value. A switching frequency of the switching control signal is several tens of kHz to several tens of MHz.

When the life determination unit 143 determines whether the end of life of the electrolytic capacitor 22 has been reached, the test control signal generation unit 142 superimposes an estimation signal generated by the life determination unit 143 on the switching control signal generated by the switching control unit 141 to generate a test control signal (second control signal).

The life determination unit 143 includes an estimation signal generation unit 30, a band-pass filter 31, an output current arithmetic filter 32, a load current estimation filter 33, and an electrolytic capacitor capacitance estimation unit 34.

The estimation signal generation unit 30 generates and outputs an estimation signal (degradation detection-purpose signal) having a pulse width sufficiently small in comparison with the duty cycle of the switching control signal generated by the switching control unit 141, at an estimation-purpose frequency $\omega_E$, which is a frequency lower than a switching frequency $\omega_s$, that is, every period of the inverse of the frequency $\omega_E$. The estimation-purpose frequency $\omega_E$ is a frequency in the proximity of a resonance frequency of the series LC resonant circuit formed by the inductor 20 and the electrolytic capacitor 22 that are included in the DC/DC converter 12. In an example, the estimation-purpose frequency $\omega_E$ is 3 kHz, and is a frequency smaller than switching frequencies of several tens of kHz to several tens of MHz. Furthermore, in an example, the duty cycle of the switching control signal is "0.45", whereas an incremental value of the width of a pulse generated by the estimation signal generation unit 30 is "0.01". That is, the duty cycle of the switching control signal is increased from 0.45 to 0.46 every period of $1/\omega_E$. For example, if it is assumed that the estimation-purpose frequency is 3 kHz and the switching frequency of the switching control signal is 3 MHz, the duty cycle of a pulse width of the switching control signal is increased from 0.45 to 0.46 once every 1000 pulses, or every one three-thousandth of a second. Thus, since an incremental value of the width of the pulse generated by the estimation signal generation unit 30 is a small value in comparison with the duty cycle, there is no possibility that the estimation signal affects the operation of the power supply apparatus 1 even when a determination as to whether the end of life of the electrolytic capacitor 22 has been reached is made while the power supply apparatus 1 is driving the load 50.

The switching element 21 is controlled by the test control signal obtained by superimposing the estimation signal having the estimation-purpose frequency $\omega_E$ on the switching control signal when a determination as to whether the end of life of the electrolytic capacitor 22 has been reached is made, and thus an induced voltage generated by the inductor 20 contains an estimation-purpose frequency component $V_{\omega E}$. Then, the output voltage $V_{out}$ obtained by the electrolytic capacitor 22 smoothing the induced voltage also contains the estimation-purpose frequency component $V_{\omega E}$.

The band-pass filter 31 is a band-pass filter that allows a frequency component in a band of the estimation-purpose frequency $\omega_E$ to pass, and extracts the estimation-purpose frequency component $V_{\omega E}$ of the output voltage $V_{out}$ from the output voltage $V_{out}$. The band-pass filter 31 extracts the estimation-purpose frequency component $V_{\omega E}$ of the output voltage $V_{out}$ over a predetermined period, and determines a maximum value of the extracted estimation-purpose frequency component $V_{\omega E}$ of the output voltage $V_{out}$ as the estimation-purpose frequency component $V_{\omega E}$ of the output voltage $V_{out}$. The value of the estimation-purpose frequency component $V_{\omega E}$ of the output voltage $V_{out}$ determined by the band-pass filter 31 is rounded to a certain number of digits, and input to the electrolytic capacitor capacitance estimation unit 34.

The output current arithmetic filter 32 uses the output voltage $V_{out}$ and the duty cycle d input from the switching control unit 141, and calculates an estimation value $I_{es}$ of an output current $I_{out}$ by using equation (2).

$$I_{es} = \frac{V_{in0}d - V_{out}}{r_d + r_l + (r_q - r_d)d} \qquad (2)$$

In equation (2), $V_{in0}$ is a direct-current component of an input voltage, d is a duty cycle, and $V_{out}$ is an output voltage. The numerator of the estimation value $I_{es}$ of the output current $I_{out}$ is a value obtained by subtracting the output voltage $V_{out}$ from an average value $V_{in0}d$ of a voltage output to the inductor 20 when the switching element 21 performs on and off switching once, that is, a voltage drop that occurs in the DC/DC converter 12.

Also, in equation (2), $r_d$ is a resistance value of the diode resistance 27, $r_1$ is a resistance value of the inductor resistance 24, and $r_q$ is a resistance value of the switching resistance 25. The denominator of the estimation value $I_{es}$ of the output current $I_{out}$ is a resistance value in which a path of a current that flows into the DC/DC converter 12 when the switching element 21 performs on and off switching once has been taken into consideration.

The estimation value $I_{es}$ of the output current $I_{out}$ is calculated by dividing the voltage drop that occurs in the DC/DC converter 12 when the switching element 21 performs on and off switching once by the resistance value in which the path of the current that flows when the switching element 21 performs on and off switching once has been taken into consideration.

Here, the direct-current component $V_{in0}$ of the input voltage, the resistance value $r_q$ of the switching resistance 25, the resistance value $r_1$ of the inductor resistance 24, and the resistance value $r_d$ of the diode resistance 27 are each stored in the output current arithmetic filter 32. The duty cycle d is input from the switching control unit 141, and the output voltage $V_{out}$ is input to the switching control unit 141. The output current arithmetic filter 32 acquires only the output voltage $V_{out}$ used when the switching control unit 141 changes the duty cycle d and the duty cycle d changed by the switching control unit 141, and calculates the estimation value $I_{es}$ of the output current $I_{out}$.

The load current estimation filter 33 includes a low-pass filter 331 and an averaging filter 332, filters the estimation value $I_{es}$ of the output current $I_{out}$ input from the output current arithmetic filter 32, extracts a direct-current component of the estimation value $I_{es}$ of the output current $I_{out}$, and outputs it as a load current $I_{LOAD}$.

The low-pass filter 331 is a filter that allows a frequency component having a frequency lower than that of the estimation-purpose frequency component $V_{\omega E}$ of the estimation value $I_{es}$ of the output current $I_{out}$ to pass. Through filtering with the low-pass filter 331, switching noise occurring due to on and off switching performed by the switching element 21, and high-frequency noise, such as the estimation-purpose frequency component $V_{\omega E}$ of the estimation value $I_{es}$ of the output current $I_{out}$, are removed from the estimation value $I_{es}$ of the output current $I_{out}$.

The averaging filter 332 averages the estimation value $I_{es}$ of the output current $I_{out}$ filtered by the low-pass filter 331 over a predetermined period, and thereby removes low-frequency noise. Although it is preferable that the input voltage $V_{in}$ of the DC/DC converter 12 have only a direct-current component, the input voltage $V_{in}$ generated by the PFC circuit 11 contains a low-frequency component of not more than 10 Hz. Since the estimation value $I_{es}$ of the output current $I_{out}$ contains the low-frequency component contained in the input voltage $V_{in}$, it is preferable to remove the low-frequency component contained in the estimation value $I_{es}$ of the output current $I_{out}$ by filtering the estimation value $I_{es}$ of the output current $I_{out}$ with the averaging filter 332. The estimation value $I_{es}$ of the output current $I_{out}$ from which the low-frequency component has been removed by the averaging filter 332 is rounded to a certain number of digits, and input to the electrolytic capacitor capacitance estimation unit 34 as the load current $I_{LOAD}$.

The electrolytic capacitor capacitance estimation unit 34 includes an electrolytic capacitor capacitance estimation table 341. The electrolytic capacitor capacitance estimation unit 34 estimates the capacitance C of the electrolytic capacitor 22 by using the estimation-purpose frequency component $V_{\omega E}$ of the output voltage $V_{out}$ input from the band-pass filter 31, the load current $I_{LOAD}$ input from the load current estimation filter 33, and the electrolytic capacitor capacitance estimation table 341.

First, the electrolytic capacitor capacitance estimation unit 34 acquires the estimation-purpose frequency component $V_{\omega E}$ of the output voltage $V_{out}$ input from the band-pass filter 31, and determines whether or not the value of the acquired estimation-purpose frequency component $V_{\omega E}$ of the output voltage $V_{out}$ is the same over a given time period. When the electrolytic capacitor capacitance estimation unit 34 determines that the value of the acquired estimation-purpose frequency component $V_{\omega E}$ of the output voltage $V_{out}$ is the same over the given time period, the electrolytic capacitor capacitance estimation unit 34 uses the acquired estimation-purpose frequency component $V_{\omega E}$ of the output voltage $V_{out}$ when estimating the capacitance C of the electrolytic capacitor 22. When the electrolytic capacitor capacitance estimation unit 34 determines that the acquired estimation-purpose frequency component $V_{\omega E}$ of the output voltage $V_{out}$ has been varied within the given time period, the electrolytic capacitor capacitance estimation unit 34 acquires an estimation-purpose frequency component $V_{\omega E}$ of the output voltage $V_{out}$ input from the band-pass filter 31 again. A determination as to whether or not the value of the acquired estimation-purpose frequency component $V_{\omega E}$ of the output voltage $V_{out}$ is the same over the given time period is made, thereby keeping the electrolytic capacitor capacitance estimation unit 34 from estimating an incorrect value as the capacitance C of the electrolytic capacitor 22.

Then, the electrolytic capacitor capacitance estimation unit 34 acquires the load current $I_{LOAD}$ input from the load current estimation filter 33, and determines whether or not the value of the acquired load current $I_{LOAD}$ is the same over a given time period. When the electrolytic capacitor capacitance estimation unit 34 determines that the value of the acquired load current $I_{LOAD}$ is the same over the given time period, the electrolytic capacitor capacitance estimation unit 34 uses the acquired load current $I_{LOAD}$ when estimating the capacitance C of the electrolytic capacitor 22. When the electrolytic capacitor capacitance estimation unit 34 determines that the acquired load current $I_{LOAD}$ has been varied within the given time period, the electrolytic capacitor capacitance estimation unit 34 acquires a load current $I_{LOAD}$ input from the load current estimation filter 33 again. A determination as to whether or not the value of the acquired load current $I_{LOAD}$ is the same over the given time period is made, thereby keeping the electrolytic capacitor capacitance estimation unit 34 from estimating an incorrect value as the capacitance C of the electrolytic capacitor 22.

FIG. 5 illustrates an example of the electrolytic capacitor capacitance estimation table 341.

In the electrolytic capacitor capacitance estimation table 341, a correspondence relationship between the capacitance C of the electrolytic capacitor 22, and the load current $I_{LOAD}$ and the estimation-purpose frequency component $V_{\omega E}$ of the output voltage $V_{out}$ is stored. That is to say, in the electrolytic capacitor capacitance estimation table 341, estimation-purpose frequency components $V_{\omega E}$s of the output voltage $V_{out}$ seen when the capacitance C of the electrolytic capacitor 22 is changed are normalized and stored for each of a plurality of load currents $I_{LOAD}$s. In the electrolytic capacitor capacitance estimation table 341 illustrated in FIG. 5, the estimation-purpose frequency component $V_{\omega E}$ of the output voltage $V_{out}$ seen when the load current $I_{LOAD}$ is 216 A and the capacitance C of the electrolytic capacitor 22 is 10000 μF is normalized as "1". Hereinafter, the normalized estimation-purpose frequency component $V_{\omega E}$ of the output voltage $V_{out}$ is also referred to as a normalized value.

As an example, the case where the determined load current $I_{LOAD}$ is 108 A and the determined estimation-purpose frequency component $V_{\omega E}$ of the output voltage $V_{out}$ is 4.06 V will be described. Here, it is assumed that, when the load current $I_{LOAD}$ is 216 A and the capacitance C of the electrolytic capacitor 22 is 10000 μF, the estimation-purpose frequency component $V_{\omega E}$ of the output voltage $V_{out}$ normalized as "1" is 3.13 V.

First, the electrolytic capacitor capacitance estimation unit 34 normalizes the determined estimation-purpose frequency component $V_{\omega E}$ of the output voltage $V_{out}$. Since the determined estimation-purpose frequency component $V_{\omega E}$ of the output voltage $V_{out}$ is 4.06 V and the estimation-purpose frequency component $V_{\omega E}$ of the output voltage $V_{out}$ normalized as "1" is 3.13 V, the electrolytic capacitor capacitance estimation unit 34 normalizes the estimation-purpose frequency component $V_{\omega E}$ of the output voltage $V_{out}$ as $$4.06/3.13=1.2971.$$

Then, the electrolytic capacitor capacitance estimation unit 34 converts the normalized value into the capacitance C of the electrolytic capacitor 22 with reference to a column of the load current $I_{LOAD}$ of 108 A. In the column of the load current $I_{LOAD}$ of 108 A, "1.2971" is larger than a normalized value of "1.2930" seen when the capacitance C of the electrolytic capacitor 22 is 7000 μF, and is smaller than a normalized value of "1.4172" seen when the capacitance C is 6000 μF. Since the capacitance C of the electrolytic capacitor 22 is 6000 μF to 7000 μF, the electrolytic capacitor capacitance estimation unit 34 makes a linear approximation from the respective normalized values seen when the capacitance C of the electrolytic capacitor 22 is 6000 μF and 7000 μF so as to estimate the capacitance C of the electrolytic capacitor 22.

Then, the electrolytic capacitor capacitance estimation unit 34 determines whether or not the estimated capacitance C of the electrolytic capacitor 22 is below a threshold value. For example, if the threshold value is 7000 µF, the electrolytic capacitor capacitance estimation unit 34 determines that the estimated capacitance C of the electrolytic capacitor 22 is below the threshold value. When the electrolytic capacitor capacitance estimation unit 34 determines that the estimated capacitance C of the electrolytic capacitor 22 is below the threshold value, the electrolytic capacitor capacitance estimation unit 34 outputs an alarm signal indicating a reduction in the capacitance C of the electrolytic capacitor 22.

Figure 6A:
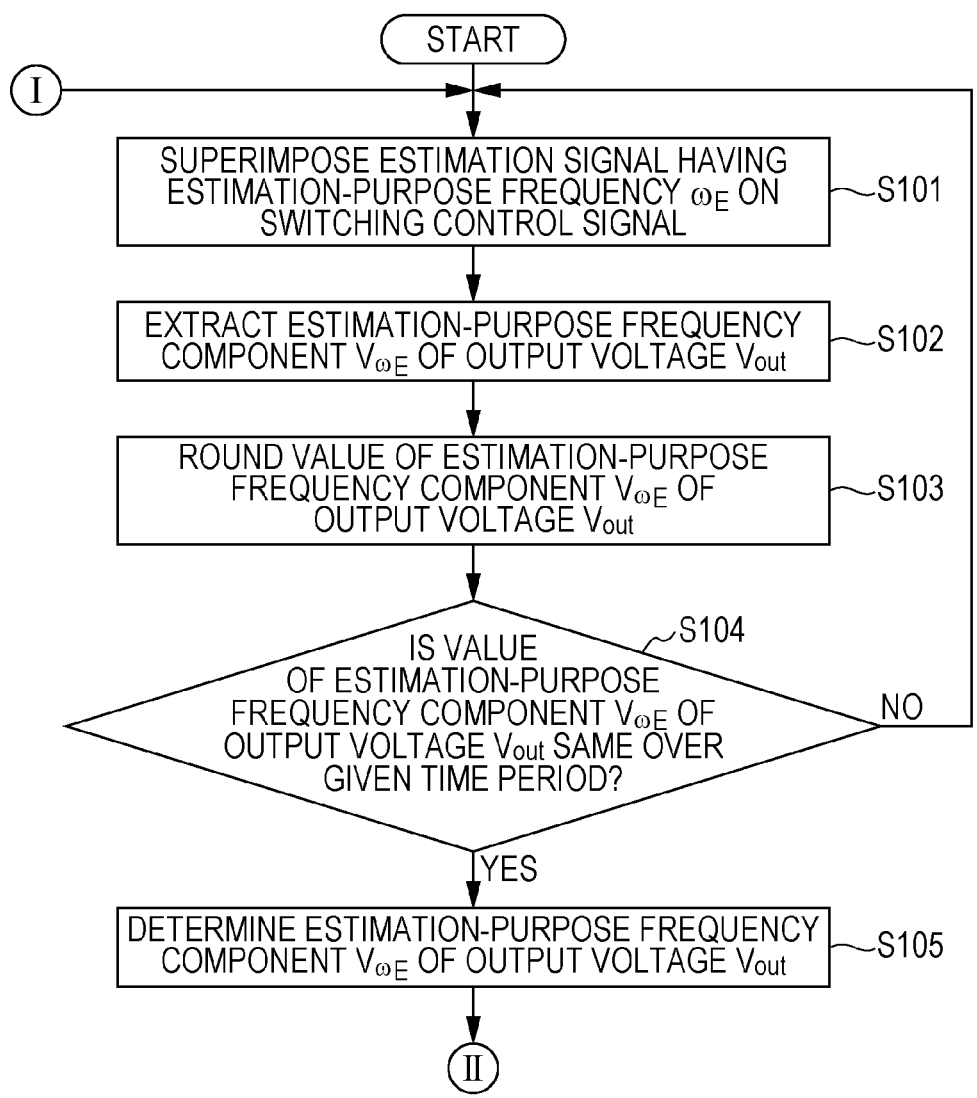
FIGS. 6A and 6B are a flowchart illustrating a process flow of a process of determining whether the end of life of an electrolytic capacitor has been reached.
Figure 6B:
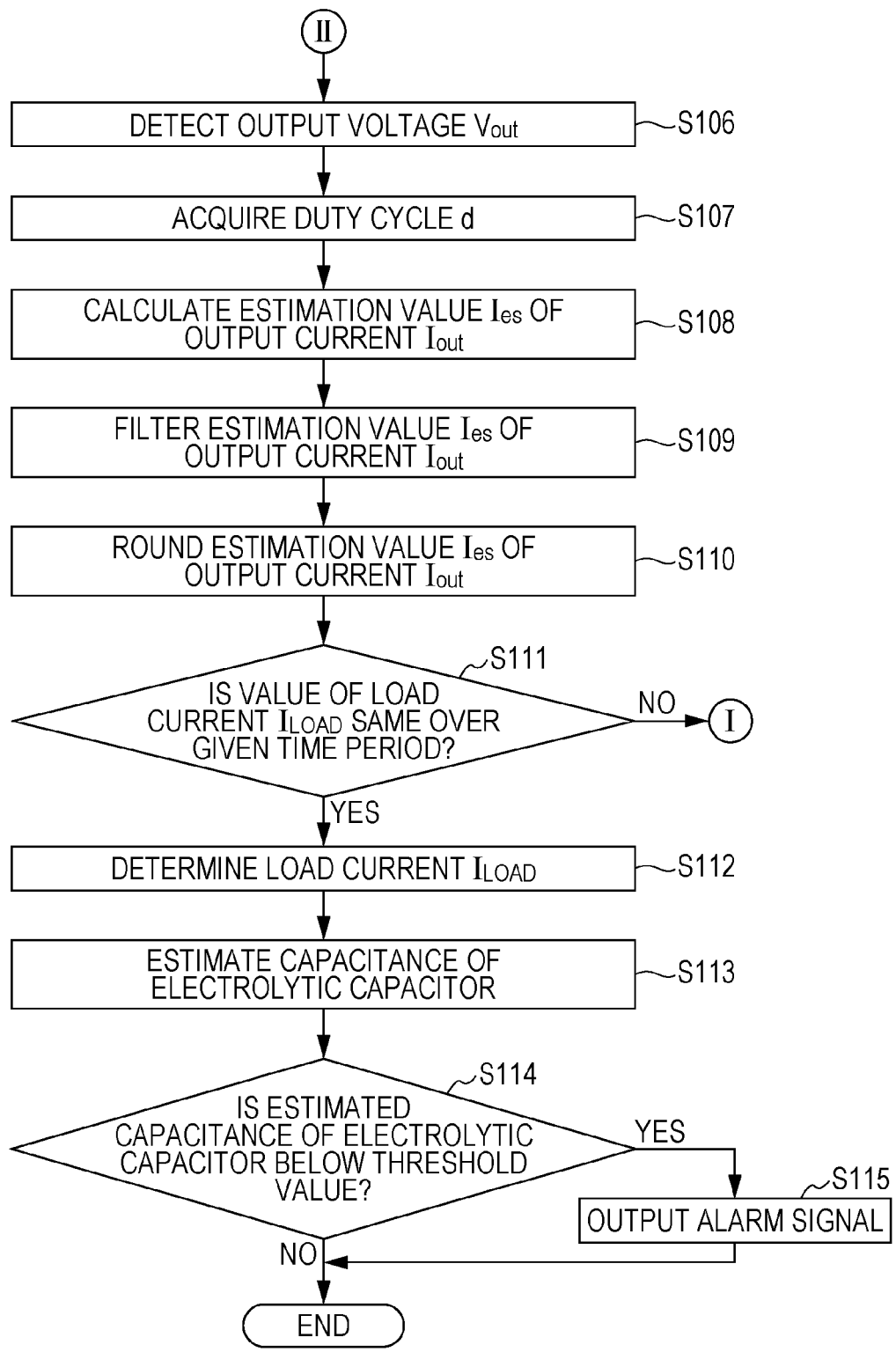

FIGS. 6A and 6B are a flowchart illustrating a process flow of a process in which the life determination unit 143 determines whether the end of life of the electrolytic capacitor 22 has been reached.

First, while the power supply apparatus 1 is driving the load 50, the estimation signal generation unit 30 superimposes an estimation signal having an estimation-purpose frequency $\omega_E$ on a switching control signal (S101).

Then, the band-pass filter 31 extracts an estimation-purpose frequency component $V_{\omega E}$ of an output voltage $V_{out}$ over a predetermined period (S102). The band-pass filter 31 extracts the estimation-purpose frequency component $V_{\omega E}$ of the output voltage $V_{out}$ over the predetermined period, and determines a maximum value of the extracted estimation-purpose frequency component $V_{\omega E}$ of the output voltage $V_{out}$ as the estimation-purpose frequency component $V_{\omega E}$ of the output voltage $V_{out}$. Then, the band-pass filter 31 rounds the value of the estimation-purpose frequency component $V_{\omega E}$ of the output voltage $V_{out}$ to a certain number of digits (S103).

Then, the electrolytic capacitor capacitance estimation unit 34 acquires a load current $I_{LOAD}$ input from the load current estimation filter 33, and determines whether or not the value of the acquired load current $I_{LOAD}$ is the same over a given time period (S104). When the electrolytic capacitor capacitance estimation unit 34 determines that the value of the acquired load current $I_{LOAD}$ is the same over the given time period, the electrolytic capacitor capacitance estimation unit 34 determines the acquired load current $I_{LOAD}$ as a load current $I_{LOAD}$ used when estimating capacitance C of the electrolytic capacitor 22 (S105). When the electrolytic capacitor capacitance estimation unit 34 determines that the acquired load current $I_{LOAD}$ has been varied within the given time period, the process returns to S101.

When the electrolytic capacitor capacitance estimation unit 34 determines that the value of the acquired load current $I_{LOAD}$ is the same over the given time period, the output current arithmetic filter 32 detects the output voltage $V_{out}$ (S106), and then acquires a duty cycle d from the switching control unit 141 (S107). Then, the output current arithmetic filter 32 calculates an estimation value $I_{es}$ of an output current $I_{out}$ by using equation (2) (S108).

Then, the load current estimation filter 33 filters the estimation value $I_{es}$ of the output current $I_{out}$, extracts a direct-current component of the estimation value $I_{es}$ of the output current $I_{out}$, and outputs it as a load current $I_{LOAD}$ (S109). Then, the load current estimation filter 33 rounds the value of the output load current $I_{LOAD}$ to a certain number of digits (5110).

Then, the electrolytic capacitor capacitance estimation unit 34 acquires the estimation-purpose frequency component $V_{\omega E}$ of the output voltage $V_{out}$ input from the band-pass filter 31, and determines whether or not the value of the acquired estimation-purpose frequency component $V_{\omega E}$ of the output voltage $V_{out}$ is the same over a given time period (S111). When the electrolytic capacitor capacitance estimation unit 34 determines that the value of the acquired estimation-purpose frequency component $V_{\omega E}$ is the same over the given time period, the electrolytic capacitor capacitance estimation unit 34 determines the acquired estimation-purpose frequency component $V_{\omega E}$ as an estimation-purpose frequency component $V_{\omega E}$ used when estimating the capacitance C of the electrolytic capacitor 22 (S112). When the electrolytic capacitor capacitance estimation unit 34 determines that the acquired estimation-purpose frequency component $V_{\omega E}$ has been varied within the given time period, the process returns to S101.

When the electrolytic capacitor capacitance estimation unit 34 determines that the value of the acquired estimation-purpose frequency component $V_{\omega E}$ is the same over the given time period, the electrolytic capacitor capacitance estimation unit 34 estimates the capacitance C of the electrolytic capacitor 22 by using the electrolytic capacitor capacitance estimation table 341 (S113).

Then, the electrolytic capacitor capacitance estimation unit 34 determines whether or not the estimated capacitance C of the electrolytic capacitor 22 is below a threshold value (S114).

When the electrolytic capacitor capacitance estimation unit 34 determines that the estimated capacitance C of the electrolytic capacitor 22 is below the threshold value, the electrolytic capacitor capacitance estimation unit 34 outputs an alarm signal (S115).

In an example, the process in which the life determination unit 143 determines whether the end of life of the electrolytic capacitor 22 has been reached is executed once a day, at the same time of day.

In the power supply apparatus 1, the life determination unit 143 acquires only a parameter used when the switching control unit 141 changes a duty cycle d, and determines whether the end of life of the electrolytic capacitor 22 has been reached, therefore enabling a determination of a life without disposing a dedicated device for life determination. In the power supply apparatus 1, since a determination of a life is made without disposing a dedicated device for capacitor's life determination, the size of the power supply apparatus 1 is not increased due to disposition of the dedicated device. Since the process performed by the life determination unit 143 may be implemented on a program that runs with a DSP or the like constituting the switching control unit 141, the life of the electrolytic capacitor 22 may be determined by only changing a program for causing the DC/DC converter control circuit 14 to execute the process, and no hardware, such as a sensor or a circuit, has to be added, therefore enabling a reduction in manufacturing costs.

Furthermore, in the power supply apparatus 1, since a test control signal is generated by superimposing an estimation signal on a switching control signal in the DC/DC converter control circuit 14, which is the DSP, there is a low possibility that noise occurs due to superimposition of the estimation signal. Since the process of determining the life of the electrolytic capacitor 22 may be executed without stopping a load driven by the power supply apparatus 1, the process of determining the life of the electrolytic capacitor 22 may be executed regardless of a load state.

In the power supply apparatus 1, since an estimation-purpose frequency component $V_{\omega E}$ of an output voltage $V_{out}$ is extracted from the output voltage $V_{out}$ by the band-pass filter 31, computational complexity may be reduced in comparison with the case where the estimation-purpose frequency component $V_{\omega E}$ of the output voltage $V_{out}$ is extracted by using a fast Fourier transform (FFT). In the FFT, the value calculated in a finite time period becomes an approximate value; however, in the power supply apparatus 1, the estimation-purpose frequency component $V_{\omega E}$ of the output voltage $V_{out}$ extracted by the band-pass filter 31 is not approximated.

Furthermore, in the power supply apparatus 1, the life determination unit 143 calculates an output current $I_{out}$ from the output voltage $V_{out}$ and the duty cycle d when estimating a load current $I_{LOAD}$, which is a direct-current component of the output current $I_{out}$, and filters the calculated output current $I_{out}$. Both of the output voltage $V_{out}$ input from the DC/DC converter 12 and the switching control signal input from the DA converter 146 to the switching element 21 contain high-frequency noise resulting from a switching frequency and low-frequency noise resulting from the PFC circuit 11. In the power supply apparatus 1, the output current $I_{out}$ calculated by the life determination unit 143 is obtained by using the duty cycle d input from the switching control unit 141, therefore making filtering relatively easy.

Furthermore, in the power supply apparatus 1, filtering of the output current $I_{out}$ is performed in two stages: filtering of a high-frequency component with the low-pass filter 331 and filtering of a low-frequency component with the averaging filter 332. In the power supply apparatus 1, the high-frequency component and the low-frequency component are filtered in two stages, thereby enabling both of the high-frequency noise resulting from a switching frequency and the low-frequency noise resulting from the PFC circuit 11 to be removed.

Furthermore, in the power supply apparatus 1, capacitance C of the electrolytic capacitor 22 is estimated by using the electrolytic capacitor capacitance estimation table 341, therefore enabling quick estimation processing of the capacitance C of the electrolytic capacitor 22.

In the power supply apparatus 1, the DC/DC converter 12 is a step-down DC/DC converter; however, may be a step-up or step-up and step-down DC/DC converter. When the DC/DC converter 12 is a step-up or step-up and step-down DC/DC converter, the output current $I_{out}$ is calculated by using an equation corresponding to each circuit layout in place of equation (2).

Furthermore, the power supply apparatus 1 includes the rectifier circuit 10 that rectifies an alternating-current voltage; however, in the case where a direct-current voltage is input, a circuit configuration in which the rectifier circuit 10 is not disposed is adopted. In accordance with a voltage to be input, a circuit configuration in which the PFC circuit 11 is omitted may be adopted.

Furthermore, in the power supply apparatus 1, the estimation signal generation unit 30 generates a numerical value at an estimation-purpose frequency $\omega_E$; however, may be configured to generate data obtained by sampling a sine wave having a small amplitude in comparison with the duty cycle d and having the estimation-purpose frequency $\omega_E$.

Furthermore, in the power supply apparatus 1, the life determination unit 143 executes a process of estimating the estimation-purpose frequency component $V_{\omega E}$ in S102 to S105, and then executes a process of estimating the load current $I_{LOAD}$ in S106 to S112. However, the process of estimating the estimation-purpose frequency component $V_{\omega E}$ in S102 to S105 may be executed after execution of the process of estimating the load current $I_{LOAD}$ in S106 to S112. Also, the process of estimating the estimation-purpose frequency component $V_{\omega E}$ in S102 to S105 may be executed simultaneously with the process of estimating the load current $I_{LOAD}$ in S106 to S112.

The power supply apparatus 1 may be installed in various devices. For example, the power supply apparatus 1 may be installed in an electronic computer, such as a server. The power supply apparatus 1 is installed in the electronic computer, and maintenance management of the electronic computer is thereby improved. The power supply apparatus 1 may also be installed in an alternating current (AC) adapter to be connected to devices, such as an electronic computer and an information terminal. The power supply apparatus 1 is installed in the AC adapter, a determination as to whether or not the end of life of an electrolytic capacitor included in the AC adapter has been reached thereby may be made, and a device to which the AC adapter is connected may be notified of a determination result. The power supply apparatus 1 may also be installed in a vending machine. The power supply apparatus 1 is installed in the vending machine, the power supply apparatus 1 thereby may be replaced in accordance with a determination result on the life of an electrolytic capacitor of the power supply apparatus 1 while the vending machine is not being used, and thus the power supply apparatus 1 may be replaced without missing sales opportunities. The power supply apparatus 1 may also be installed in an automated meter-reading terminal placed in a monitoring center or the like deep in a mountain. The power supply apparatus 1 is installed in the automated meter-reading terminal, and a route of replacement work of the power supply apparatus 1 thereby may be made more efficient. The power supply apparatus 1 may also be installed in an automated teller machine (ATM) and a ticket-vending machine. The power supply apparatus 1 is installed in the ATM and the ticket-vending machine, and the power supply apparatus 1 thereby may be replaced during off-peak times during which the ATM and the ticket-vending machine are not being used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A power supply apparatus comprising:
   a DC/DC converter comprising:
      an inductor to which an input voltage is applied;
      a switching element that switches a current flowing to the inductor on and off so as to cause an induced voltage to be generated;
      an electrolytic capacitor that smoothes a voltage responsive to the induced voltage and outputs the voltage to a load; and
   a control circuit that controls the switching element,
   wherein the control circuit
      outputs, to the switching element, a second control signal obtained by superimposing an estimation signal on a first control signal, wherein the first control signal performs on and off control on the switching element at a switching frequency and changes a duty cycle so that an output voltage becomes a predetermined voltage, and the estimation signal has an estimation-purpose frequency lower than the switching frequency,
      detects the output voltage, the output voltage being based on switching performed by the switching element, the switching being controlled by the second control signal, and estimates capacitance of the electrolytic capacitor by using the detected output voltage, the duty cycle of the first control signal, and a frequency component of the estimation signal contained in the detected output voltage.

2. The power supply apparatus according to claim 1, wherein the control circuit estimates a load current of the DC/DC converter by using the detected output voltage and the duty cycle, and estimates the capacitance of the electrolytic capacitor from the load current and an estimation-purpose frequency component contained in the output voltage based on a correspondence relationship between the capacitance of the electrolytic capacitor, the load current and the estimation-purpose frequency component contained in the output voltage.

3. The power supply apparatus according to claim 2, wherein the control circuit calculates an output current output to the load of the DC/DC converter by dividing a difference between a value obtained by multiplying the input voltage by the duty cycle and the output voltage, by an internal resistance value of the DC/DC converter including internal resistances of the inductor and the switching element, and estimates, as the load current, a current obtained by extracting at least a frequency component lower than the estimation-purpose frequency component from the calculated output current.

4. The power supply apparatus according to claim 2, wherein the control circuit has a table indicating the estimation-purpose frequency component of the output voltage seen when the load current and the capacitance of the electrolytic capacitor are each changed.

5. The power supply apparatus according to claim 3, wherein the control circuit removes at least the frequency component not lower than the estimation-purpose frequency component from the output current, and estimates that an average value of the output current from which the frequency component not lower than the estimation-purpose frequency component has been removed is the load current.

6. A control apparatus that controls a DC/DC converter including:

an inductor to which an input voltage is applied, a switching element that switches a current flowing to the inductor on and off so as to cause an induced voltage to be generated, and an electrolytic capacitor that smoothes a voltage responsive to the induced voltage and outputs the voltage to a load, wherein the control apparatus outputs, to the switching element, a second control signal obtained by superimposing an estimation signal on a first control signal, wherein the first control signal performs on and off control on the switching element at a switching frequency and changes a duty cycle so that an output voltage becomes a predetermined voltage, and the estimation signal has an estimation-purpose frequency lower than the switching frequency, detects the output voltage, the output voltage being based on switching performed by the switching element, the switching being controlled by the second control signal, and estimates capacitance of the electrolytic capacitor by using the detected output voltage, the duty cycle of the first control signal, and a frequency component of the estimation signal contained in the detected output voltage.

7. A computer-readable and non-transitory storage medium storing a program that controls a DC/DC converter including:

an inductor to which an input voltage is applied, a switching element that switches a current flowing to the inductor on and off so as to cause an induced voltage to be generated, and an electrolytic capacitor that smoothes a voltage responsive to the induced voltage and outputs the voltage to a load, wherein the computer program causes a control apparatus to execute an operation, the operation comprising:

outputting, to the switching element, a second control signal obtained by superimposing an estimation signal on a first control signal, wherein the first control signal performs on and off control on the switching element at a switching frequency and changes a duty cycle so that an output voltage becomes a predetermined voltage, and the estimation signal has an estimation-purpose frequency lower than the switching frequency;

detecting the output voltage, the output voltage being based on switching performed by the switching element, the switching being controlled by the second control signal; and estimating capacitance of the electrolytic capacitor by using the detected output voltage, the duty cycle of the first control signal, and a frequency component of the estimation signal contained in the detected output voltage.

* * * * *